United States Patent [19]
Golobay

[11] Patent Number: 5,124,886
[45] Date of Patent: Jun. 23, 1992

[54] DRIVE CANISTER MOUNTING MODULE

[75] Inventor: Gary L. Golobay, Wichita, Kans.

[73] Assignee: NCR Corporation, Dayton, Ohio

[21] Appl. No.: 659,771

[22] Filed: Feb. 25, 1991

[51] Int. Cl.$^5$ .............................................. H05K 7/16
[52] U.S. Cl. ................... 361/391; 361/390; 361/394; 361/399; 361/415; 364/708
[58] Field of Search ............ 361/390, 391, 392, 393, 361/394, 396, 399, 415; 364/708

[56] References Cited

U.S. PATENT DOCUMENTS

| | | | |
|---|---|---|---|
| 4,688,864 | 8/1987 | Sorel | 439/74 |
| 4,700,275 | 10/1987 | Wood | 361/393 |
| 4,754,397 | 6/1988 | Varaiya et al. | 364/200 |
| 4,833,554 | 5/1989 | Dalziel et al. | 360/98.04 |

FOREIGN PATENT DOCUMENTS 0712984  1/1980  U.S.S.R. ............... 361/391

Primary Examiner—Leo P. Picard
Assistant Examiner—Young S. Whang
Attorney, Agent, or Firm—James M. Stover

[57] ABSTRACT

A modular cabinet for enclosing a plurality of disk drive canisters. The cabinet includes left and right sides and a center section, each formed of molded structural foam. Each side includes horizontal top and bottom portions which include tongue-like projections for mating with similar features in top and bottom portions of the center section. The sides and center section are secured together through the use of four latching members which cooperate with features molded into the sides. The design of the components permits easy assembly of the cabinet without the use of tools. Horizontal rails molded into the internal surfaces of the sides and both surfaces of the center section form the bays for receiving disk drive canisters.

11 Claims, 8 Drawing Sheets

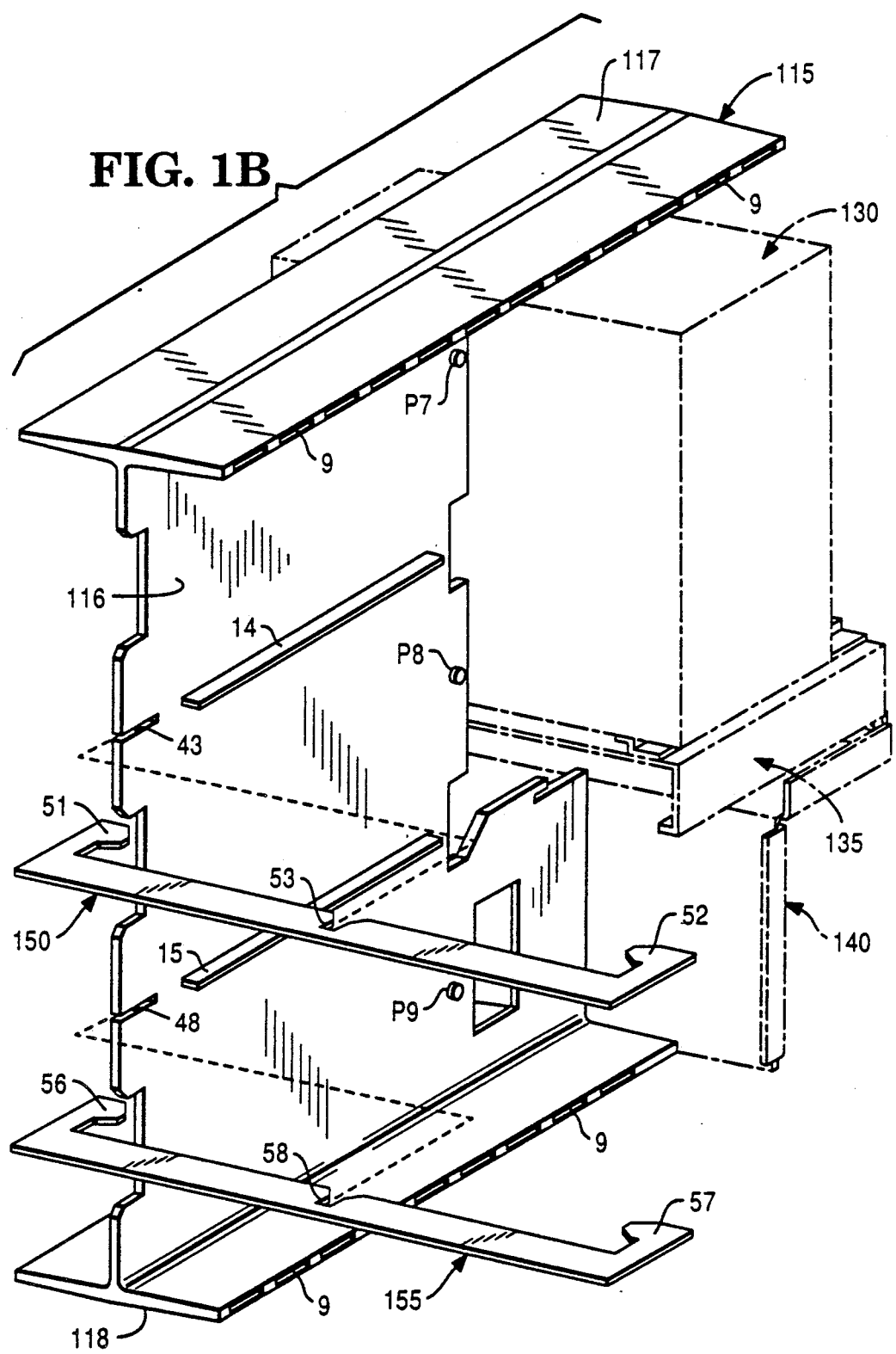

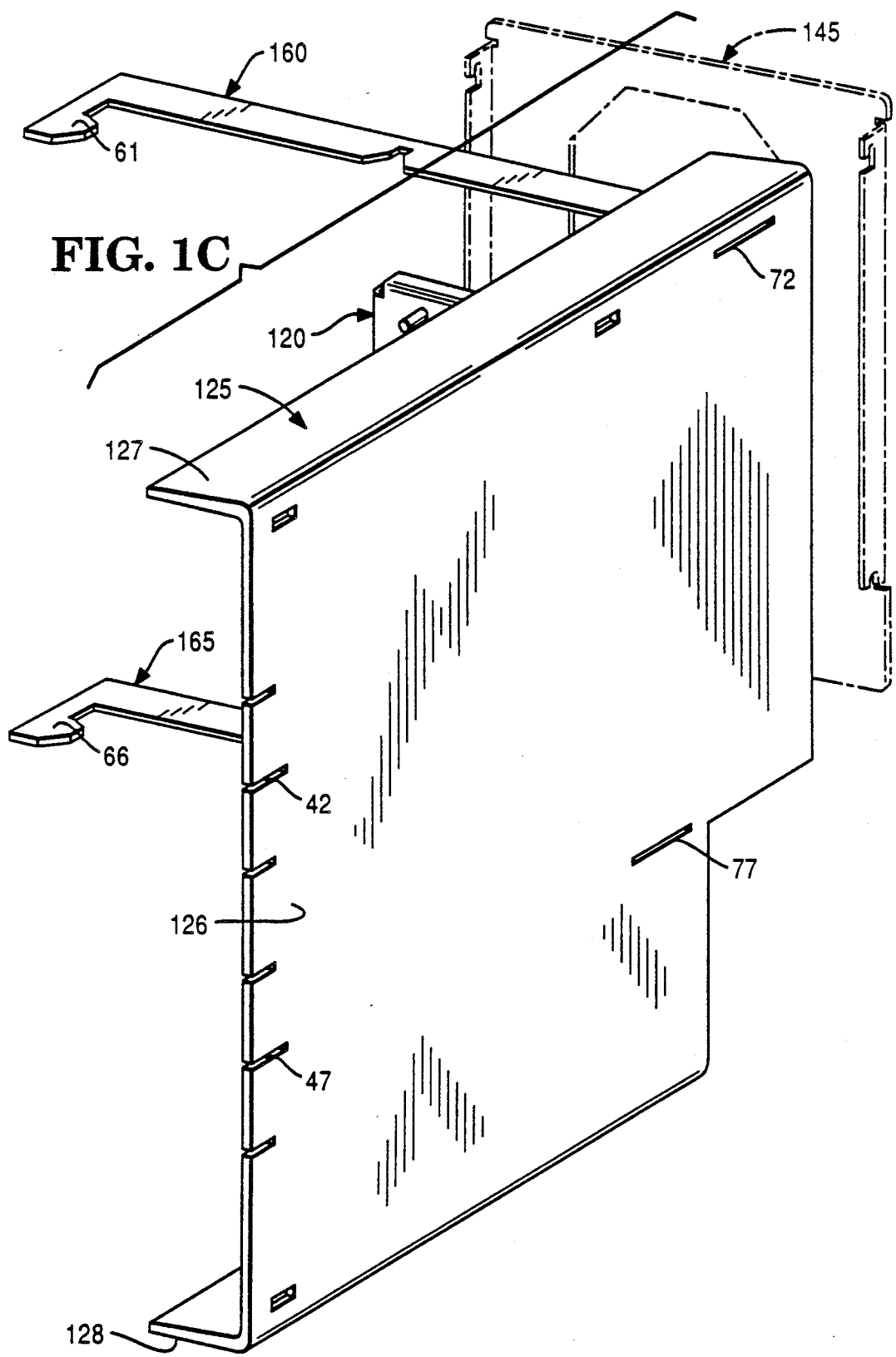

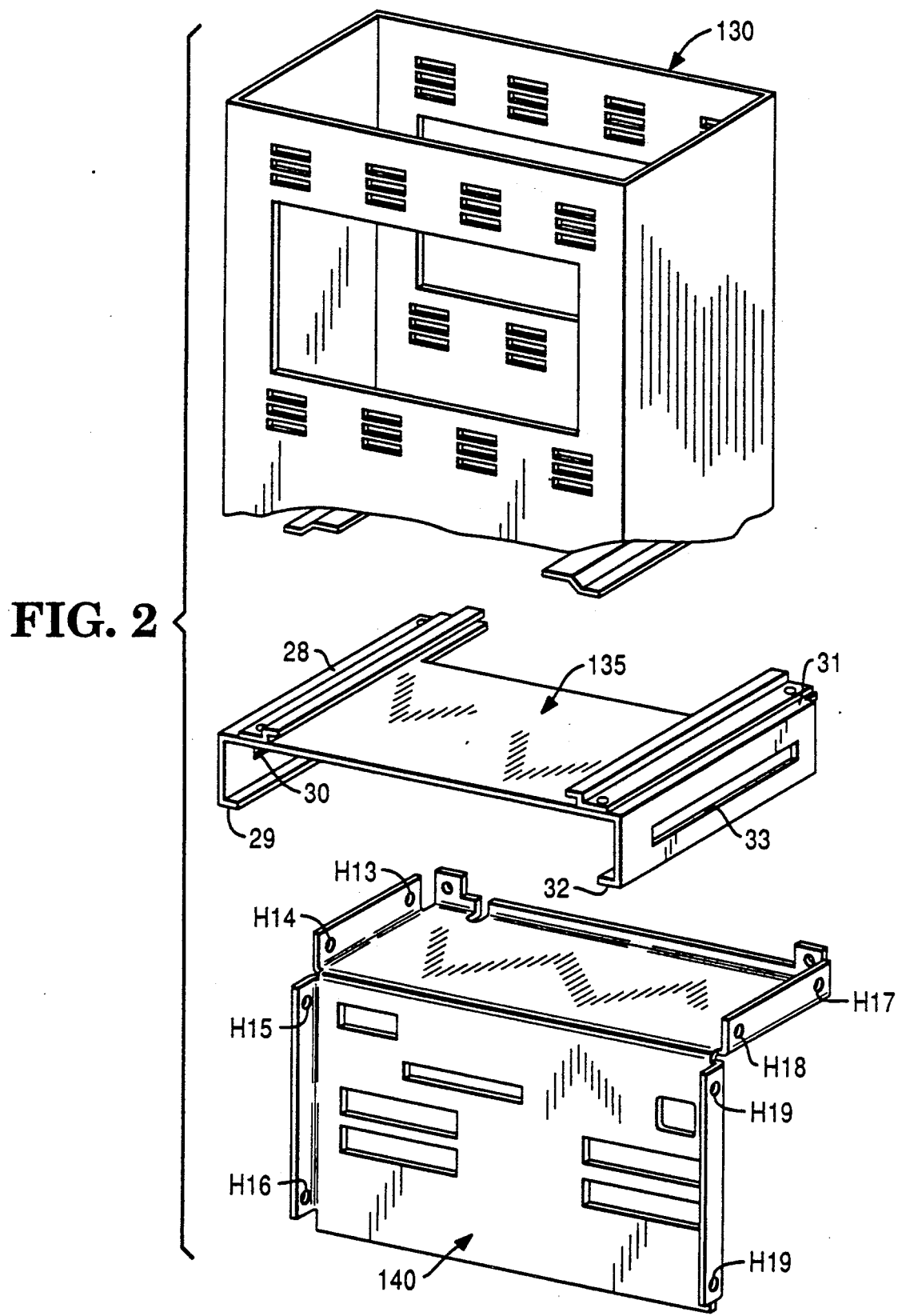

DRIVE CANISTER MOUNTING MODULE

The present invention relates to computer component cabinetry and, more particularly, to a modular cabinet for housing multiple magnetic disk drive canisters.

BACKGROUND OF THE INVENTION

Magnetic disk drives form the most common external or secondary memory means utilized in present day computer systems, providing nonvolatile storage of operating software, application software, and data. As the size, speed and capacity of computer system processors and main memory continue to increase, so do the requirements for greater capacity secondary memory. Secondary memory speed must also grow in order to maintain system balance. Networking of computer system components and the complexity of modern software further intensifies demands on secondary memory capacity and speed.

To address greater secondary memory requirements, many computer systems include a plurality of magnetic disk drives. In many systems redundant disk drives are also included to protect against the loss of software and data in the event of a disk drive failure. Increasing use is also being made of arrays of inexpensive, small capacity, disks to provide increased capacity and greater transfer rates at costs less than similarly sized large disks.

The use of a plurality of disk drives in a computer system can present aesthetic and physical problems. Limitation of space, difficulties in connecting several drives with other system components, and a cluttered appearance are some of the problems that can potentially be encountered when several disk drives are placed together in the same locality. Cabinetry is required to securely organize and protect the plurality of disk drives.

It is desirable to have a cabinet with a modular design, which is easy to assemble, which utilizes a minimum number of fasteners to secure together the cabinet components, and which is cost effective to manufacture and assemble. Assembly can be simplified by providing a minimum number of cabinet components and component designs that permit rapid, error-free assembly of the cabinet, preferably without the use of tools or traditional fasteners such as screws. Cost effectiveness is achieved as a result of a cabinet design which permits simplified assembly and further the utilization of molded or extruded components.

OBJECTS OF THE INVENTION

It is therefore an object of the present invention to provide a new and improved cabinet for housing a plurality of computer equipment canisters.

It is another object of the present invention to provide such a cabinet which is simple to manufacture and assemble.

It is yet another object of the present invention to provide such a cabinet including a minimum number of components, the components of which are secured together with a minimum number of fasteners.

It is still a further object of the present invention to provide a disk drive canister mounting module of modular design having a minimum number of components and fasteners permitting rapid, error free assembly.

It is also an object of the present invention to provide a disk drive canister mounting module, the components of which can be assembled without the use of tools.

SUMMARY OF THE INVENTION

There is provided, in accordance with the present invention, a modular cabinet for housing a plurality of disk drive canisters. The cabinet is formed of three principal components:

(1) a left side having a vertical portion, and top and bottom horizontal portions disposed along the full width of the top and bottom edges of the vertical portion, respectively, and protruding from the right, internal, surface of the vertical portion;

(2) a right side constructed similarly to the left side of the cabinet, having a vertical portion, and top and bottom horizontal portions disposed along the full width of the top and bottom edges of the vertical portion, respectively, and protruding from the left, internal, surface of the vertical portion; and (3) a center section having a vertical portion, and top and bottom horizontal portions disposed along the full width of the top and bottom edges of the vertical portion, respectively, and protruding to the left and right of the vertical portion.

The vertical sections of the two side members and the center section have the same height and width. In addition, the top and bottom portions of the side members and the center section have the same length. Horizontal rails are provided along the internal surfaces of the vertical sections of the left and right sides and both surfaces of the vertical section of the center section. The horizontal rails are located at corresponding locations along each surface.

Latching means are provided for securing the sides and center section together without the use of tools. The sides and center section when secured together form the cabinet, the top portions of the sides and the center section forming the top wall of the cabinet, and the bottom portions of the sides and the center section forming the bottom wall of the cabinet.

In the described embodiment, the sides and center section of the cabinet are formed of structural foam, such as GE Noryl FN215. The internal surfaces of the vertical section of the left and right sides and both surfaces of the vertical section of the center section each include two horizontal rails, equally spaced between the top and bottom edge of the surface so that six canister bays, two columns having three bays in vertical arrangement, are formed when the sides and center section are assembled.

The described embodiment further includes a power supply assembly in the rear of the assembled cabinet, and means for closing the back of the cabinet.

The above objects and other objects, features, and advantages of the present invention will become apparent from the following detailed specification when read in conjunction with the accompanying drawings in which applicable reference numerals have been carried forward.

BRIEF DESCRIPTION OF THE DRAWINGS

FIG. 1B is a perspective view of the center section of the preferred embodiment of the present invention. Power supply support structure and the lower rear cabinet cover are shown in phantom.

FIG. 1C is a perspective view of the right side, the right side backpanel and the rear cabinet cover, shown in phantom, of the preferred embodiment of the present invention.

FIG. 2 is an exploded perspective view of the power supply support structure and lower rear cabinet cover shown in phantom in FIG. 1B.

DETAILED DESCRIPTION OF THE PREFERRED EMBODIMENT

Figure 1A:
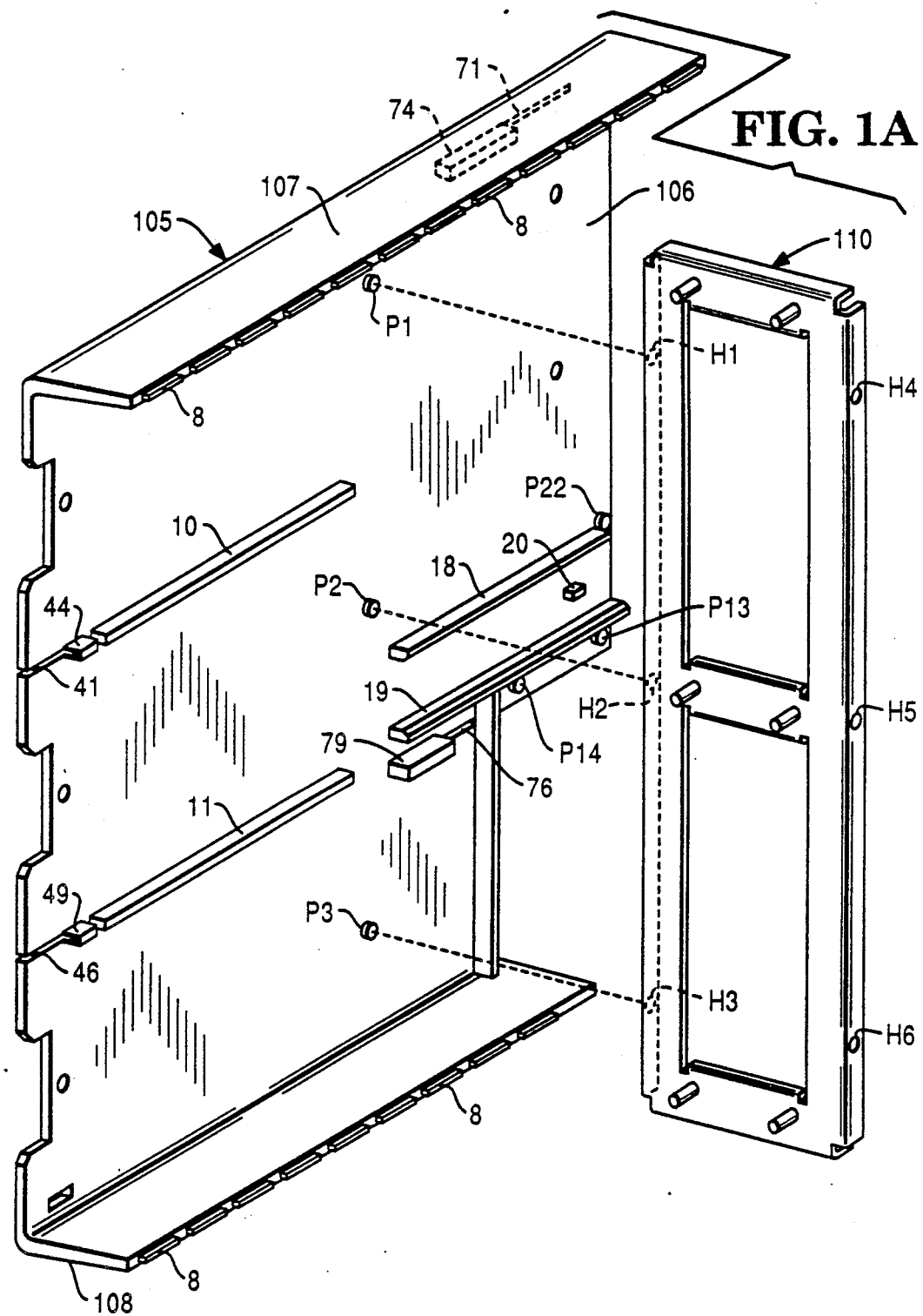
FIG. 1A is a perspective view of the left side of the preferred embodiment of the present invention. Also shown is the connection of a left side backpanel member to the left side in accordance with the method of assembly of the present invention.

The disk drive canister mounting module which comprises the preferred embodiment of the present invention includes left and right sides and a center section, all formed of molded structural foam, which when secured together forms a module or cabinet having six bays for, receiving six, 5 ¼ inch, disk drive canisters. FIGS. 1A through 1C illustrate in perspective view the primary components of the disk drive canister mounting module, principally the left sides 105, center section 115 and right side 125 of the canister. Viewed together, FIGS. 1A through 1C form an exploded view of the module or cabinet which is shown in an assembled state in FIGS. 4 and 5.

Referring now to FIG. 1A of the drawings, the left side 105 and left backpanel 110 are shown. Left side 105 consists essentially of a vertical panel 106, but also includes narrow top and bottom horizontal portions 107 and 108 disposed along the full width of the top and bottom edges of the vertical panel, respectively, and protruding from the right, internal, surface of the vertical panel, thereby producing a "[" shaped vertical cross section for the left side panel.

The edges of top and bottom portions 106 and 107 are provided with tongue-like projections 8 that cooperate with grooves 9 molded into the top and bottom portions of center section 115, shown in FIG. 1B, to assist in the joining and alignment of side 105 with center section 115. Numerous other features are molded into the right, internal surface of vertical panel 106. These features include support rails 10 and 11; pins P1, P2, P3, P13, P14 and P22; guide rails 18 and 19; and stop 20. These features and their functions will be discussed in greater detail below.

Left packpanel 110 is rectangular in shape, having a height approximately equivalent to the height of left side panel 105. Several holes, identified with the designations H1 through H6, are provided along narrow flanges at the left and right sides of backpanel 110. Holes H1, H2 and H3, provided along the backpanel's left flange mate with projections or pins P1, P2 and P3, respectively, molded into the right, internal surface of vertical panel 105. When assembled, pins P1 through P3 engage with holes H1 through H3 to secure left side 105 and backpanel 110 together in proper alignment.

FIG. 1B is a perspective view of the center section 115 of the disk drive canister mounting module. The center section consists of a vertical panel 116 having top and bottom horizontal portions 117 and 118 disposed along the top and bottom edges of the vertical panel, respectively. Top and bottom portions 117 and 118 extend equally left and right the vertical panel producing a "I" shaped vertical cross section for the center section.

The depth dimension of the center section and top and bottom portions thereof is equivalent to the depth of the left side 105. The left and right edges of top and bottom portions 117 and 118 include grooves 9 which assist in the joining and alignment of center section 115 with left side 105 and right side 125, as discussed above. The right side surface of vertical panel 116 includes some of the same features seen on the right side surface of vertical panel 106 in FIG. 1A. These features include support rails 14 and 15 and pins P7 through P9. The left side of vertical panel 116, which is hidden from view in FIG. 1B, also includes these features.

A large area is removed from the upper rear of the center section vertical panel 116 to accommodate a power supply card cage 130 and slide 135, both shown in phantom. Also shown in FIG. 1B are latch means 150 and 155 and lower rear cabinet cover 140, shown in phantom.

FIG. 1C provides a perspective view of right side 125 and obstructed views of right backpanel 120, rear latches 160 and 165, and fan panel 145, shown in phantom. Right side 125 is nearly identical to left side 105, but reversed. The inner surface of the right side, which is hidden from view in FIG. 1C, includes features corresponding to support rails 10 and 11; pins P1, P2, P3, P13, P14 and P22; guide rails 18 and 19; and stop 20 shown in FIG. 1A. Backpanel 120 is identical to backpanel 110 and latches 160 and 165 are the same in construction to latches 150 and 155 shown in FIG. 1B.

Figure 3:
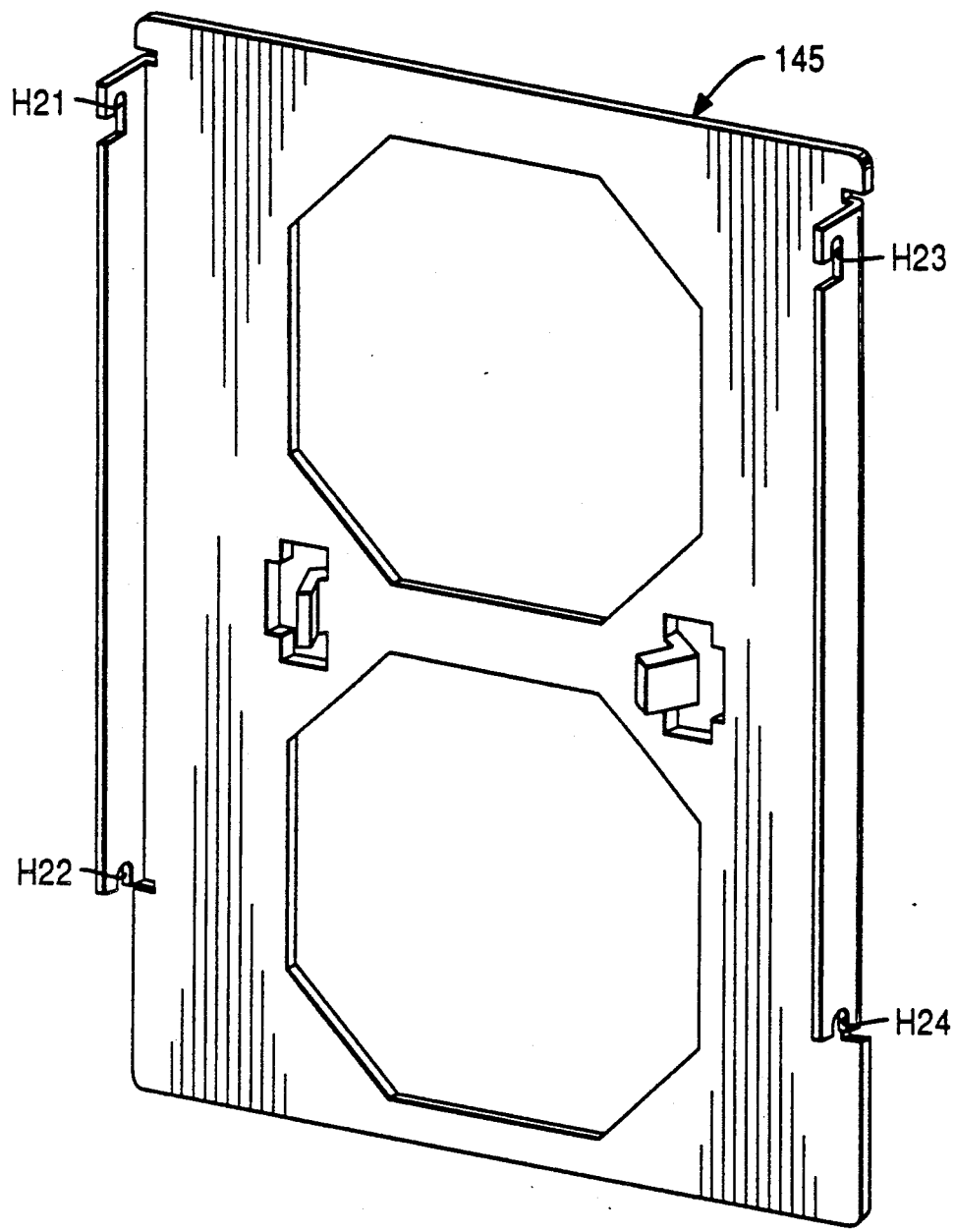
FIG. 3 is a perspective view of the fan panel, or upper rear cabinet cover, shown in phantom in FIG. 1C.

FIGS. 2 and 3 illustrate details of power supply card cage 130, slide 135, lower back cover 140 and fan panel 145 not available in FIGS. 1B and 1C.

The disk drive canister mounting module includes a minimum number of component parts designed to simplify assembly. Assembly is further facilitated by the utilization of a minimum number of fasteners for securing together the component parts without the use of tools. Assembly is accomplished in the manner set hereinafter.

Assembly begins by laying left side 105 on a flat horizontal surface with to and bottom portions 107 and 108 in a vertical position. Backpanel support 110, which may include a cable subassembly for providing power, control and data signal flow between installed disk drive canisters and the mounting module, is then placed vertically onto left side 105 such that pins P1 through P3 projecting from the internal surface of left side 105 engage with holes H1 through H3, respectively, in the left flange of backpanel 110.

Assembly continues with the placement of center section 115 on top of left side 105 so that the tongues 8 and grooves 9 in the top and bottom portions of the left side and center section mesh. Additionally, center section 115 includes three pins, hidden from view in FIG. 1B, projecting from the left surface of the vertical panel opposite pins P7 through P9 which mate with holes H7 through H9, respectively, in the right flange of backpanel 110.

Power supply cage 130 and slide 135 are next placed into position within the assembly. Prior to installation into the cabinet assembly, the power supply cage is rigidly affixed to the top of slide 135. The left side of slide 135 is placed between guide rails 18 and 19 so that surfaces 28 and 29 reside within guide rails 18 and 19 and slot 30, a portion of which is shown in FIG. 2, is placed over stop 20. Any cable connections between installed backpanel 110 and power supply card cage 130 should be done at this time.

Next, lower rear panel cover 140, containing all the communication and power cables is placed into position with holes H13 through H16 (shown in FIG. 2) engaging with corresponding pins molded into left side 105. Two of these pins, P13 and P14, are shown in FIG. 1A. Cable connections between the lower rear panel cover, installed backpanel 110 and power supply card cage 130 should be done at this time.

Right side backpanel support 120 is thereafter installed in the same manner as backpanel 110. Backpanel 120 includes a left side flange having mounting holes that mate with pins P7 through P9 shown in FIG. 1B. Finally, right side 125 is placed over the prior assembled components, with molded features engaging with grooves 9 of center section 115, mounting holes in backpanel 120 and lower rear cover 140, and the right side of slide 135.

The assembly of the disk drive canister mounting module is completed by the installation of latches 150, 155, 160 and 165 and the placement of fan panel 145 onto the back of the module. Latch 150 is pressed into slots 41, 42 and 43 in the front of side panels 105 and 125 and center section 115 until tabs 51 and 52 are interlocked with latch receptacle 44 molded into side 105 behind slot 41 and a similar feature molded into side 125 behind slot 42. Latch 155 is similarly installed into slots 46, 47 and 48 in the front of the module. Latch 160 is installed into slots 71 and 72, and latch 165 is installed into slots 76 and 77 in the back of the module. Latch receptacles 44, 49, 74 and 79 are paired with similar features molded into the internal side of right side 125 for receiving and locking with latches 150, 155, 160 and 165. The fan panel, shown in FIG. 3, includes four slotted holes H21 through H24 which engage with pins at the rear of sides 105 and 125 of the uprighted module.

Figure 4A:
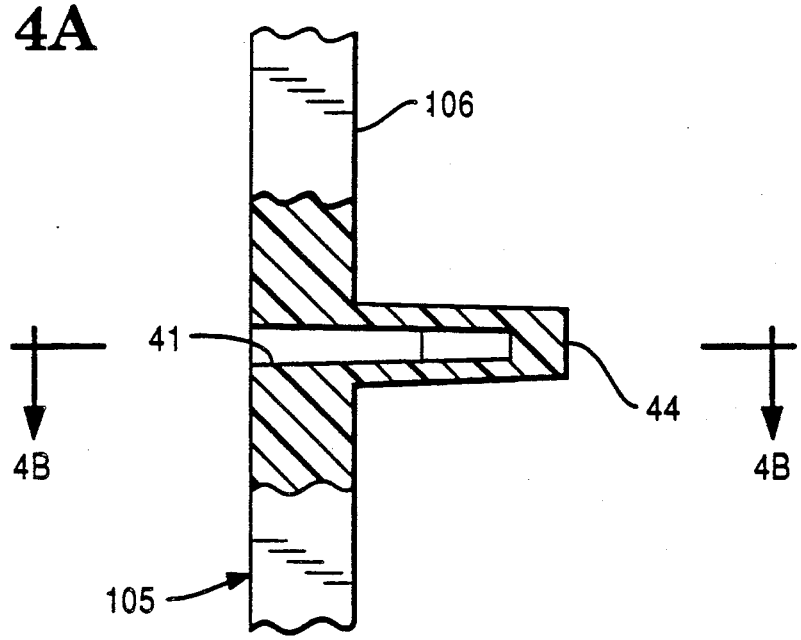
FIGS. 4A through 4C are detailed cut-away views showing portions of the latching mechanism utilized to secure the cabinet members together.
Figure 4B:
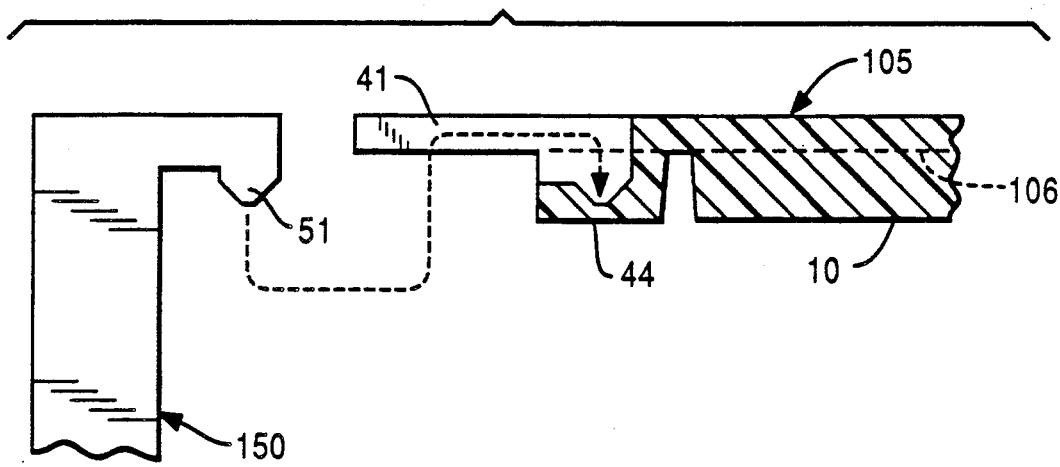
Figure 4C:
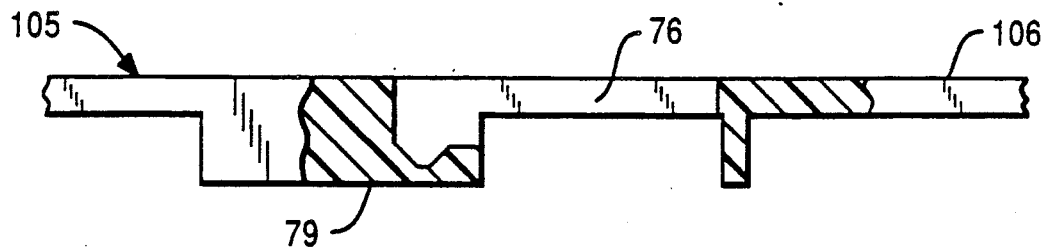

A better understanding of the engagement between latches 150, 155, 160 and 165 and their corresponding latch receptacles is provided by referring to FIGS. 4A through 4C. FIG. 4A is a cut-away view into the front of latch receptacle 44. FIGS. 4B and 4C provide cross-sectional views through latch receptacles 44 and 79, respectively.

As can be seen in FIGS. 4A and 4B, slot 41 extends into receptacle 44. The cavity molded into the receptacle is formed in the same shape as tab 51 of latch 150. During assembly, latch 150 is placed into slots 41 and 46 and tabs 51 and 56 are guided thereby into the corresponding receptacles. Upon contact between the tabs and their corresponding receptacles, latch 150 and the receptacles are deformed. When installation of the latch has been completed the shapes of the latch elements return to normal, securing the tabs inside the receptacle cavities. The front and side edges of latch 150 are flush with the front and side cabinet surfaces when installed. Latches 155, 160 and 165 similarly engage with their corresponding receptacles.

Figure 5:
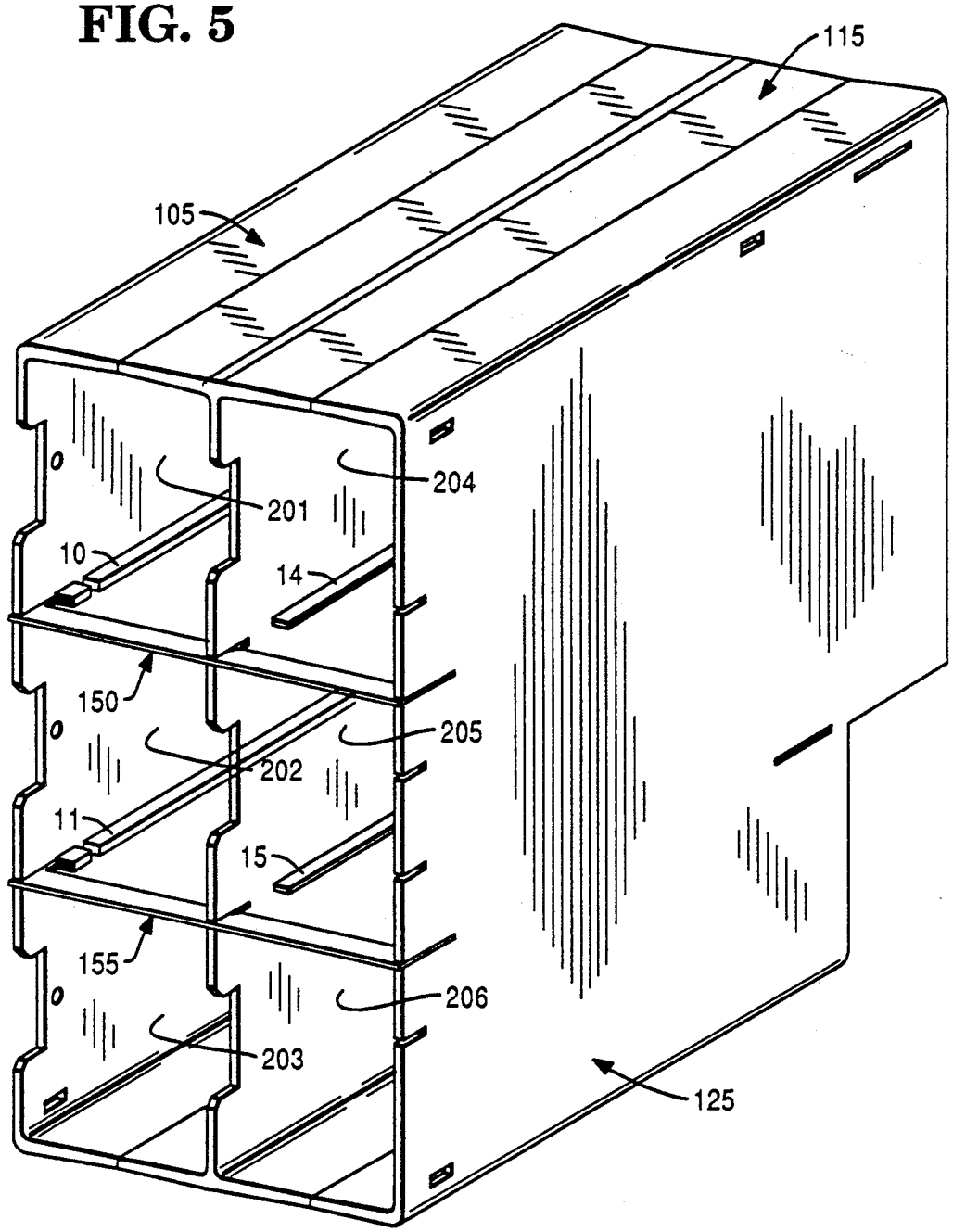
FIG. 5 is a perspective view of the preferred embodiment of the present invention, in an assembled state.
Figure 6:
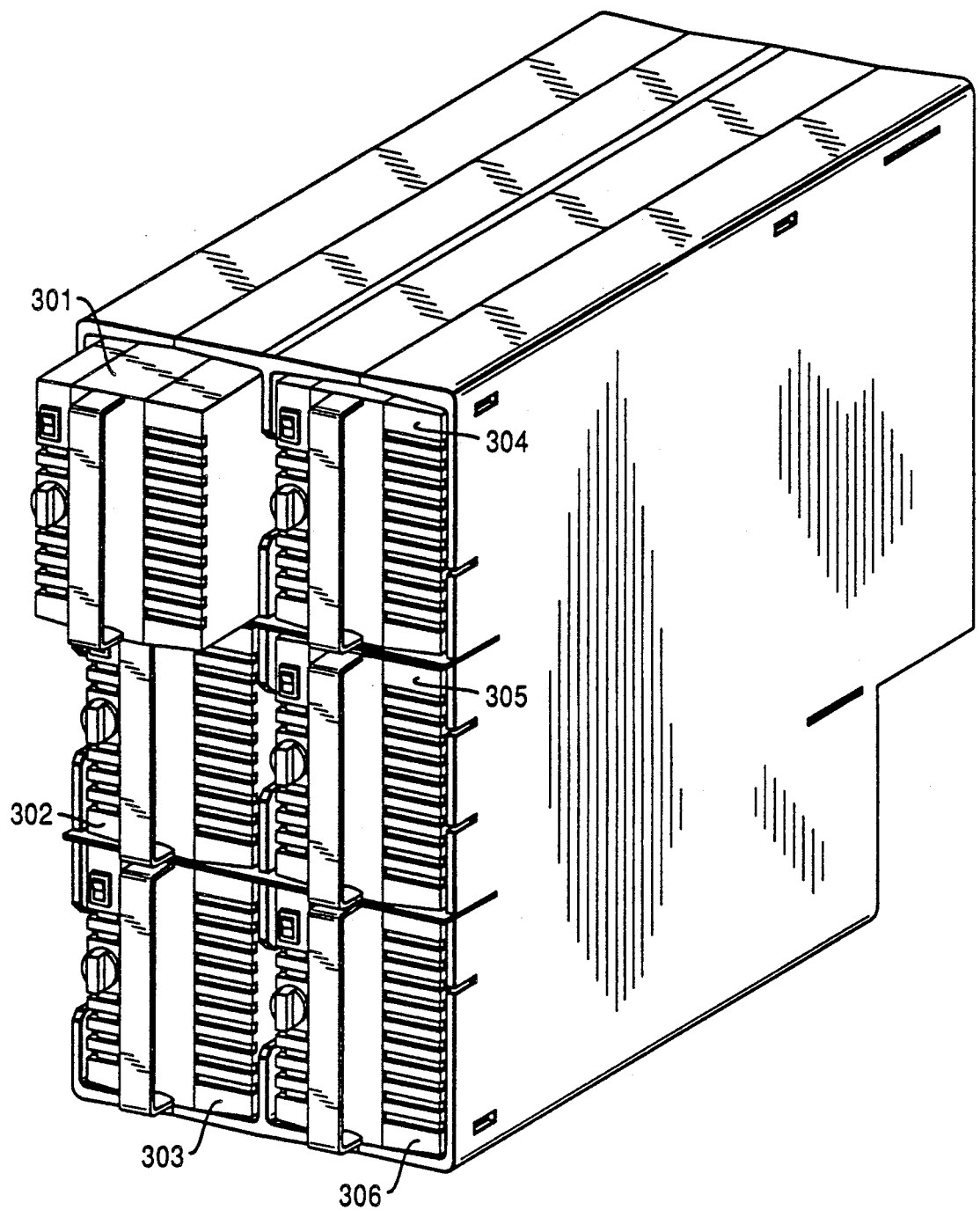
FIG. 6 is a perspective view of the preferred embodiment of the present invention, illustrating the interaction of disk drive canisters with the mounting module of the present invention.

A perspective view of the assembled module is shown in FIG. 5. As shown therein, the assembled module includes six canister bays 201 through 206. Rails 10, 11, 14, 15 and corresponding rails protruding from the hidden surfaces of center section 115 and side 125 define the bottom of bays 201, 202, 204 and 205, and provide support for disk drive canisters placed into the bays. FIG. 6 provides a perspective view of the mounting module with disk drive canisters 301 through 306 installed into the canister bays.

It can thus be seen that there has been provided by the present invention a computer cabinet for housing a plurality of disk drive canisters, or other similarly sized components. The cabinet is modular in design, providing for vertical part installation, part nesting, part alignment and easy cable routing. The cabinet is easily assembled with a minimum number of fasteners and without the use of tools.

Although the presently preferred embodiment of the invention has been described, it will be understood that various changes may be made within the scope of the appended claims.

What is claimed is:

1. A cabinet for housing a plurality of disk drive canisters, comprising:
  a left side including
    a vertical portion:
    top and bottom horizontal portions disposed along the full width of the top and bottom edges of said vertical portion, respectively, and protruding from the right, internal, surface of said vertical portion; and
    at least one horizontal rail affixed to the internal surface of said vertical portion;
  a right side including:
    a vertical portion;
    top and bottom horizontal portions disposed along the full width of the top and bottom edges of said right side vertical portion, respectively, and protruding from the left, internal, surface of said right side vertical portion; and
    at least one horizontal rail affixed to the internal surface of said vertical portion, said last-recited rails being provided at locations corresponding with the locations of the rails affixed to said left side; and
  means securing said left side with said right side;
  whereby the top portions of said sides form the top wall of said cabinet, and the bottom portions of said sides and said center section form the bottom wall of said cabinet; and
  whereby said horizontal rails divide said cabinet into a plurality of bays for receiving said disk drive canisters.

2. The cabinet according to claim 1, wherein said means for securing said left side to said right side comprises:
  a plurality of latches; and
  a pair of latch receiving means associated with each one of said plurality of latches, each of said pairs including a first latch receiving means integrated into said left side and a second latch receiving means integrated into said right side.

3. The cabinet according to claim 2, wherein said left side, said right side and said center section are formed from structural foam.

4. The cabinet according to claim 3, wherein said structural foam is GE Noryl FN215.

5. A cabinet for housing a plurality of disk drive canisters, comprising:
- a left side having a vertical portion, and top and bottom horizontal portions disposed along the full width of the top and bottom edges of said left side vertical portion, respectively, and protruding from the right, internal, surface of said vertical portion;
- a right side having a vertical portion, and top and bottom horizontal portions disposed along the full width of the top and bottom edges of said right side vertical portion, respectively, and protruding from the left, internal, surface of said right side vertical portion;
- a center section having a vertical portion, and top and bottom horizontal portions disposed along the full length of the top and bottom edges of said center section vertical portion respectively, and protruding to the left and right of said center section vertical portion;
- said internal surfaces of the vertical sections of said left and right sides and both surfaces of the vertical section of said center section having horizontal rails affixed thereto, said rails being provided at corresponding locations along each surface; and
- means securing said left side to said center section and said right side to said center section;
- whereby the top portions of said sides and said center section form the top wall of said cabinet, and the bottom portions of said sides and said center section form the bottom wall of said cabinet; and
- whereby said horizontal rails divide said cabinet into a plurality of bays for receiving said disk drive canisters.

6. The cabinet according to claim 5, wherein said top and bottom portions of said left side, said right side and said center section include interconnecting features formed in the edges of said top and bottom portions for aligning and securing said left side with said center section and said right side with said center section.

7. The cabinet according to claim 6, wherein said means for securing said left side to said center section and said right side to said center section comprises:
- a plurality of latches; and
- a pair of latch receiving means associated with each one of said plurality of latches, each of said pairs including a first latch receiving means integrated into said left side and a second latch receiving means integrated into said right side.

8. The cabinet according to claim 7, wherein the vertical and top portions of said left and right sides extend rearward of said drive canister bays thereby forming an additional bay for housing power supply components and electrical connections.

9. The cabinet according to claim 8, further including:
- a power supply card cage assembly for housing said power supply components; and
- means for slideably mounting said power supply card cage assembly within said power supply bay, said mounting means being movable between a first position wherein said card cage is contained within said power supply bay and a second position wherein said card cage is removed from said power supply bay.

10. The cabinet according to claim 8, further comprising a backpanel assembly providing separation of said drive canister bays from said power supply bay, the internal surfaces of said left and right sides including features for aligning and securing said backpanel assembly within said cabinet.

11. The cabinet according to claim 10, wherein said backpanel assembly includes electrical connections located at the rear of each of said drive canister bays, said connections mating with corresponding electrical connections provided at the rear of each of said drive canisters.

* * * * *